US008503076B2

(12) United States Patent
Birk et al.

(10) Patent No.: US 8,503,076 B2
(45) Date of Patent: Aug. 6, 2013

(54) APPARATUS FOR THE DETECTION OF LIGHT IN A SCANNING MICROSCOPE

(75) Inventors: Holger Birk, Meckesheim (DE); Volker Seyfried, Nussloch (DE)

(73) Assignee: Leica Microsystems CMS GmbH, Wetzlar (DE)

( * ) Notice: Subject to any disclaimer, the term of this patent is extended or adjusted under 35 U.S.C. 154(b) by 631 days.

(21) Appl. No.: 12/600,646

(22) PCT Filed: May 6, 2008

(86) PCT No.: PCT/EP2008/055537
§ 371 (c)(1), (2), (4) Date: Apr. 26, 2010

(87) PCT Pub. No.: WO2008/141919
PCT Pub. Date: Nov. 27, 2008

(65) Prior Publication Data

US 2010/0214654 A1 Aug. 26, 2010

(30) Foreign Application Priority Data

May 22, 2007 (DE) ......................... 10 2007 024 074

(51) Int. Cl.
*G02B 21/00* (2006.01)

(52) U.S. Cl.
USPC ........................................... 359/368; 359/487

(58) Field of Classification Search
USPC .................................................. 359/368, 487
See application file for complete search history.

(56) References Cited

U.S. PATENT DOCUMENTS

| | | | | |
|---|---|---|---|---|
| 4,458,260 | A | 7/1984 | McIntyre et al. | |
| 5,532,474 | A | 7/1996 | Dautet et al. | |
| 6,785,302 | B1 | 8/2004 | Engelhardt et al. | |
| 7,477,449 | B2 * | 1/2009 | Knebel et al. | 359/385 |
| 2004/0031930 | A1 | 2/2004 | Wolleschensky et al. | |
| 2004/0190133 | A1 * | 9/2004 | Engelhardt et al. | 359/385 |
| 2006/0215264 | A1 | 9/2006 | Birk et al. | |

FOREIGN PATENT DOCUMENTS

| | | |
|---|---|---|
| DE | 19842153 | 3/2000 |
| DE | 10257237 | 6/2003 |
| DE | 102004003993 | 3/2005 |
| DE | 102005059948 | 8/2006 |
| EP | 1132725 | 9/2001 |
| WO | 03/098200 | 11/2003 |
| WO | 2005/048319 | 5/2005 |
| WO | 2006/037248 | 10/2005 |

OTHER PUBLICATIONS

PCT/IB/338 issued in PCT/EP2008/055537.

(Continued)

*Primary Examiner* — James Jones
(74) *Attorney, Agent, or Firm* — Schlee IP International, P.C.; Alexander R. Schlee

(57) ABSTRACT

A light detector for use in a line scanning microscope and a microscope comprising such a light detector are described. The light detector comprises a line array of avalanche semiconductor detectors; and an electronic trigger circuit that is adapted to operate the avalanche semiconductor detectors in at least one of a Geiger mode with internal charge amplification and in a linear mode. The trigger circuit further comprises a parallel counter that is designed to read out in parallel light pulses detected by the avalanche semiconductor detectors. The parallel counter is adapted to accumulate the light pulses detected by the avalanche semiconductor detectors over a preset counting time.

16 Claims, 8 Drawing Sheets

(56) References Cited

OTHER PUBLICATIONS

PCT/IB/373 issued in PCT/EP2008/055537.
PCT/IB/237 issued in PCT/EP2008/055537.
Rochas et al: “Actively Recharged Single Photon Counting Avalanche Photodiode Integrated in an Industrial CMOS Process”; Swiss Federal Institute of Technology, Institute of Microelectronics and Microsystems, Aug. 14, 2003.

* cited by examiner

APPARATUS FOR THE DETECTION OF LIGHT IN A SCANNING MICROSCOPE

CROSS-REFERENCE TO RELATED APPLICATIONS

This application is a national phase entry based on the International Patent Application PCT/EP2008/055537 filed on May 6, 2008 that claims the priority of the German patent application DE 102007024074.2 dated May 22, 2007. The entire content of this prior German patent application is herewith incorporated by reference.

BACKGROUND OF THE INVENTION

The invention relates to a light detector for use in a scanning microscope, and in particular in a line scanning microscope. Further, the invention relates to a microscope comprising the light detector according to the invention.

Scanning microscopes are used in very different fields of engineering and sciences. A basic principle of such scanning microscopes is that one or more microscope beams are deflected in one or more dimensions by means of a beam deflector arrangement in order to screen (scan) a sample.

Various versions of scanning microscopes are known, which differ, for instance, in the type and generation of the microscope beam. For example, use can be made of electromagnetic beams in the optical, infrared or ultraviolet range of the spectrum, or in other ranges of the electromagnetic spectrum, for instance in the radiographic range. Also other types of beams are possible, such as particle beams in the form of electron beams or in the form of charged or neutral particles. It is also conceivable to use several microscope beams at the same time.

Further differences between the various types of scanning microscopes result from the interaction of the microscope beam or microscope beams with the sample to be examined. In the following description reference is made primarily to fluorescence microscopes, whose microscope beam excites a sample fluorescence which can be detected and used for image acquisition. However, numerous further measuring principles exist, such as measuring principles based on laser-spectroscopic methods, measuring principles based on particle emission, and other measuring principles. The following invention can be basically applied to all such methods.

A basic problem, which plays a major role in many of the microscopes described above as well as in other image acquisition methods, is the signal-to-noise-ratio and/or the signal strength of the signals to be detected. In particular, in fluorescence microscopy the saturation of the colorants used becomes noticeable in this respect, which saturation limits the maximum obtainable signal per pixel. Depending on the scanning speed and image format, often not enough fluorescence photons are available. The periods of time during which a single pixel of a detector is illuminated in a scanning cycle are typically no longer than some few nano seconds to some few 10 nano seconds. For example in a resonant bidirectional scanning apparatus with a scanning speed of 16,000 lines per second and 1,024 points per line, typically 25 nano seconds are available per pixel in the center of the image. For a signal-to-noise ratio of 20, it would be necessary to detect 400 photons per pixel (shot noise). This corresponds to $1.6 \cdot 10^{10}$ detected photons per second or, with an assumed wavelength of 600 nm ($3.3 \cdot 10^{-19}$ J/photon), to a fluorescence performance of the actually detected photons of 5.3 nW. Assuming that only one quarter of the photons coming from the sample arrive at the detector and that this detector detects only about one quarter of the incoming photons, a fluorescence performance of at least about 84.8 nW must be emitted by the sample. With an assumed fluorescence lifetime of $5 \cdot 10^{-9}$ s this corresponds to 1,280 colorant molecules which have to emit permanently (saturatedly) in the focus area.

This arithmetic example shows that the signal-to-noise ratio is a basic problem in scanning microscopes since for procedural reasons only an extremely limited period of time is available for gathering light quantums for single pixels. Increasing this time period however entails increasing the time for image formation which involves inconveniences for a user and/or which can lead to blurring of the image in case of quickly changing samples.

The CCD chips (charge-coupled device) normally used as image detectors in microscopes further cause additional difficulties in the form of increased noise. For example in CCDs, in addition to shot noise, readout noise is often dominating especially at small signal levels, which noise as a rule increases even further as the speed increases. Moreover, in line scanners as compared to point scanners optical resolution is reduced. The speed depends above all on the frame rate of the camera. For the particularly sensitive EMCCDs the maximum pixel rates are at present at about 35 MHz, which at 1 k·1 k corresponds to a frame rate of 30 frames per second.

Other types of image detectors than CCD image detectors are also known in the art. So-called avalanche semiconductor diodes (avalanche photodiodes), which are based on the effect of internal charge amplification, are particularly well suited for the high speeds necessary for scanning microscopy. Avalanche semiconductor diodes (also abbreviated as APDs in the following) are highly sensitive, fast photodiodes which can for instance be silicon-based. Usual APDs make e.g. use of InGaAs—InP-multy layer constructions. APDs may be operated in a linear range, in which the current signal is at least approximately linear to the number of irradiated photons, and, above a breakdown voltage, in a non-linear range, in which range the avalanche effect mentioned above occurs and which is also referred to as Geiger range.

The use of APD detectors, including in an array-arrangement, has been suggested repeatedly also in the field of microscopy. For instance DE 10 2005 059 948 A1 describes a detector which can be used above all for the spectral detection of light in a microscope. In this document it is suggested, among other things, to provide the detector with an APD-array.

Also DE 10 2004 003 993 A1 describes the use of an APD-array. In this document it is suggested to spectrally split up light of a spatially delimited source and to scan the spectrum with the help of an APD array.

APD arrays can be produced by means of semiconductor production methods known to a person skilled in the art. One example of a corresponding production method is described in U.S. Pat. No. 4,458,260. In this document an APD array is described which comprises numerous p-n junctions. Various layer assemblies for APDs and APD arrays are known in the art.

Despite the various previous suggestions to use APD arrays in the field of microscopy, however, the use of such arrays still poses a technical challenge. One particular difficulty consists in acquiring the great volume of data in a suitable manner and to process it at a corresponding speed. Also in many cases the dead time, which is a known problem in APDs, leads to difficulties, since it further reduces the length of image time available for 1 pixel and increases fluctuations in the counting rates.

SUMMARY OF THE INVENTION

It is therefore an object of the present invention to provide a light detector which is particularly suited for use in scanning microscopes and which avoids the problems of known arrangements described above. In particular the light detector is to enable a quick and reliable acquisition of image data.

This object is solved by a light detector for use in a line scanning microscope, comprising: a line array of avalanche semiconductor detectors; and an electronic trigger circuit that is adapted to operate the avalanche semiconductor detectors in at least one of a Geiger mode with internal charge amplification and in a linear mode, the trigger circuit further comprising a parallel counter, wherein the parallel counter is designed to read out in parallel light pulses detected by the avalanche semiconductor detectors and the parallel counter is adapted to accumulate the light pulses detected by the avalanche semiconductor detectors during a preset counting time. The aforementioned object is further solved by a microscope comprising the aforementioned light detector.

DETAILED DESCRIPTION OF THE INVENTION

The aforementioned light detector is particularly suited for use in a scanning microscope. In particular this scanning microscope, i.e. a microscope which scans a sample with the help of at least one light beam, is supposed to be a line scanning microscope. Such a line scanning microscope is a scanning microscope which scans one line of a sample at a time whereby data of all points on this line is acquired simultaneously.

The light detector comprises a line array of semiconductor photo diodes, the line array including a plurality of avalanche semiconductor diodes. In particular these avalanche photodiodes and the line array, respectively, may be an array constructed in accordance with known semiconductor techniques, e.g. a monolithic line array, such as a line array as described in U.S. Pat. No. 4,458,260. Also other known production techniques for producing the line array and the avalanche semiconductor detectors contained therein are possible, such as a non-monolithic construction. For example InP—InGaAs-heterojunction photo diodes may be used here as well.

In general, avalanche semiconductor detectors are designed so that they can use an internal charge carrier amplification for detecting weak light signals, such as signals occurring for example in the detection of scattered light. The size of typical detector areas of single avalanche semiconductor diodes of the line array is in the range of about 100 μm·100 μm, and the edge lengths of the active area are preferably between 20 μm and 50 μm. The detector areas do not necessarily have to be quadratic, so that for instance rectangular areas are possible, e.g. areas with edge lengths of 10 μm×100 μm. The "pitch", i.e. the distance between the center point of an avalanche semiconductor detector and the center point of an adjacent avalanche semiconductor detector, also measures between several 10 and several 100 μm. It is preferred that the line array has a linear filling factor (ratio of the width of the active area of an avalanche semiconductor to its pitch) of at least 50 percent, preferable of at least 70 percent and in a particularly preferred embodiment of at least 80 percent.

The line array should be designed such that it can scan picture elements of an entire image line of a microscope image. For this purpose it is preferred that the line array comprises at least 256 avalanche semiconductor detectors, while a preferred embodiment comprises 512 avalanche semiconductor detectors, and a particularly preferred embodiment comprises 1,024 semiconductor detectors. A higher number is also conceivable, however, and can be realized with ordinary semiconductor structuring techniques.

Moreover, the light detector according to the present invention comprises an electronic trigger circuit which is designed to operate the avalanche semiconductor detectors in a Geiger mode with internal charge amplification. Alternately or additionally, however, operation in a linear mode is also possible. It is particularly preferred to adapt the trigger circuit such that the avalanche semiconductor detectors can be operated in a one-on-one photon mode (single photon mode), i.e. such that each single light pulse or signal of an avalanche semiconductor detector corresponds to a single photon, or such that the avalanche semiconductor detector is adapted to detect single photons. Such single photon APDs are known in the art.

Further, the trigger circuit comprises at least one parallel counter which is adapted to accumulate the light pulses detected by the single avalanche semiconductor detectors during a preset counting time. As described above, the "light pulses" mentioned can in particular be single signals, and in particular single current or voltage signals, which correspond to single photons detected by the avalanche semiconductor detector of the line array. The preset counting time can for instance be preset by the parallel counter such that only during the preset counting time pulses are counted. Alternately or additionally the avalanche semiconductor detector may also for instance be designed such that it only actually detects light pulses during the counting time, for example by biasing the avalanche semiconductor detector in a corresponding manner only during this counting time. The counting time can preferably correspond to the scanning speed of the scanning microscope, i.e. for instance to 25 nanoseconds per pixel as mentioned in the introduction. In particular the counting time may be based on the time available for a single line; however it is also possible that unused time intervals occur during the transition between adjacent lines.

The line array provides a substantial advantage for use in scanning microscopy when compared to point scanners in that the time available for the detection of photons is multiplied by the number of pixels of a line array. An entire line of an image can be read out with high sensitivity and considerably reduced noise as compared to usual CCD arrays. It is also possible to detect single photons. Moreover the trigger circuit can be implemented such that as opposed to common CCD arrays all picture elements, i.e. all avalanche semiconductor diodes, can be read out at the same time. This results in a considerably increased detection speed.

The light pulses detected by the single avalanche semiconductor detectors during the preset counting time can be accumulated in various ways. Detection can be carried out for instance by simply accumulating charges, which are then jointly read out. However, it is particularly preferred to detect single photons, as described above, and to then read out the light signals produced by the avalanche semiconductor detectors individually, which signals are then accumulated electronically in an electronic counter. This procedure enables for instance the use of various counting procedures, since e.g. the signals of single detectors can be accumulated. Instead, it is also possible to count single photons with this arrangement, which procedure may for instance be selectable for the user.

The parallel counter can in particular comprise an analogue/digital converter to digitalize analogue signals. It is particularly preferred for the parallel counter to alternately or additionally comprise at least one FPGA and/or at least one CPLD. An FPGA (field programmable gate array) is a programmable semiconductor component which contains programmable logical components and which as a rule is designed as a matrix. It is possible to in essence freely program connections between these single logical components so that for instance certain avalanche semiconductor detectors of the line array can be logically connected as desired or according to parameters preset by the user of a microscope, for example by means of an OR-connection.

Similarly also a CPLD (complex programmable logic device) possessing a programmable diodes matrix is a programmable logic component which can be used for similar purposes. In particular the FPGA and/or the CPLD can be used to implement the parallel counter as described above in a flexible and convenient manner. In particular the FPGA and/or the CPLD can be programmed such that they accumulate the detected light pulses during the counting time. Also further operations can be carried out.

One problem of known avalanche semiconductor detectors consists in the fact that comparably long "dead times" may occur between single counting pulses. With regard to the technology involved, these dead times are in particular caused by the fact that the generated "charge avalanche", which occurs in the Geiger mode, causes a temporary breakdown of the high block voltage until the charge distribution within the semiconductor detector is "deleted" and the original state necessary for operating the APD is re-established. Dead times are caused also by the external circuitry, since a delay occurs when charging the APD anew after a light pulse, which delay corresponds to the inertia performance of an RC circuit.

In accordance with the invention it is therefore suggested to provide the light detector with several line arrays. For instance two line arrays may be provided whereby for example in one line scan two picture elements on the two line arrays, i.e. a first avalanche semiconductor detector on the first line array and a second avalanche semiconductor detector on the second line array, are assigned to one picture element on the line. This may e.g. be realized by arranging the two line arrays in parallel to each other so that the first and the second avalanche semiconductor detectors are arranged in a y-direction (perpendicular to the longitudinal extension of the line array, which may be denoted with x).

In this arrangement, the trigger circuit can be designed to obtain the sum of the light pulses detected by the first avalanche semiconductor detector and the second avalanche semiconductor detector.

This modification of the invention provides the advantage that the active area of a picture element on an image line is now doubled and at the same time divided into two subareas (or more, depending on the number of line arrays) which can be read out independently. It is highly likely that during the dead time of one avalanche semiconductor detector the second avalanche semiconductor detector is active, so that this second detector can continue to register photons. In this way the problem caused by dead times of avalanche semiconductor detectors is greatly reduced.

Accumulating the signals of the avalanche semiconductor detectors assigned to each other on the first line array and on the second line array (and on further line arrays, if any) can be done in various manners. On the one hand this accumulation can be carried out in a purely electronic manner, e.g. by accumulating the electronic signals of the avalanche semiconductor detectors assigned to each other to form a sum signal which is subsequently output to a common counter input of the parallel counter. This common counter input then already counts the sum of the registered signals. The electronic accumulation can for instance be made by means of a simple current accumulation.

Alternately or additionally the accumulation of the signals of the avalanche semiconductor detectors assigned to each other may also be implemented by means of logic components or corresponding software. It is particularly preferred to use the parallel counter for this purpose. For example the signals of the single avalanche semiconductor detectors of the different line arrays assigned to each other may be sent to separate signal inputs of the parallel counter for this purpose, the parallel counter being adapted (e.g. by corresponding programming of the logical components) to accumulate the signals of the avalanche semiconductor detectors assigned to each other.

For any one of the above described accumulating or counting processes the parallel counter may in particular comprise a memory area including several memory cells. These memory cells can then be assigned to single avalanche semiconductor detectors of the line arrays or of one line array. Preset values (for example the preset value "1") may be assigned to these memory cells, which preset values correspond to an idle state in which no signals are detected. The trigger circuit may then be configured to temporarily increase or lower the value of the memory cell whenever one or more of the avalanche semiconductor detectors assigned to this memory cell detect a light pulse. In case a single photon is detected, for instance, the value of the memory cell assigned to the avalanche semiconductor detector which has detected the photon can be lowered temporarily from the value "1" to the value "0". The string of values of the memory cells which can be read out may then for example correspond to the image information of the line detector. Also accumulation can be easily carried out this way, for instance by accumulating those bit strings of the line array which have been registered during the counting time in a corresponding manner. Also the accumulation of a plurality of line arrays, for instance of two line arrays arranged in parallel, or the accumulation of the avalanche semiconductor detectors assigned to the same picture element on one line, respectively, can be easily realized in this manner. The values of the memory cell can be reset to the original preset values after the detection has taken place and/or with a preset reading-out clock rate so that the counting can start anew.

Moreover, the light detector can comprise a plurality of micro lenses which are each adapted to focus incoming light onto one or several avalanche semiconductor detectors. This modification is particularly advantageous when several avalanche semiconductor detectors are assigned to one picture element on a line, for instance in the case of two line arrays arranged in parallel. In this case e.g. micro cylinder lenses can be used to uniformly illuminate two avalanche semiconductor detectors assigned to each other.

Alternately or additionally to the use of a plurality of line arrays as suggested above, and in particular of two line arrays, also single avalanche semiconductor detectors can be wired up in a suitable manner so as to reduce the effects of the dead times of the single avalanche semiconductor detectors or the dead time itself even further. Such circuitry is known in the art and is generally based on impedance matching of the APD circuits triggered by a light pulse. By means of this temporary impedance matching, charging of the APD and resetting of the original state after the recording of a photon and the generation of a charge distribution caused by it are accelerated. This process is also known as "quenching" (deletion) and the active use of this effect is known as "active quenching". The main trick in this circuitry lies in the fact that the measuring resistor, which generally limits the charging time and which is connected in series with the APD, is temporarily short-circuited or connected up with a low resistance after recording the charge pulse (possibly with a preset delay) by means of a transistor circuit (or some other type of circuit), so that for instance a switching point behind the APD is temporarily grounded by means of a transistor switch or a resistor in the RC circuit of the APD is bypassed resulting in a considerably lowered overall RC constant of APD recharging. The switching of this transistor switch may be carried out via a corresponding delay component and may e.g. be triggered by means of the actual signal generated by the APD. An example of such a circuit is shown in the U.S. Pat. No. 5,532,474. However, other types of active quenching are also possible and can be realized within the scope of the present invention.

As described above, the light detector as suggested can in particular be used in a scanning microscope. Therefore also a microscope is suggested which comprises a light source for illuminating a sample, a scanning device for scanning the sample with one or more light beams originating from the light source, and a light detector corresponding to one of the above embodiments. The light detector is arranged within the microscope such that it detects light emitted and/or transmitted and/or reflected from the sample (depending on the measuring arrangement). The microscope may in particular be designed as a confocal microscope. Preferably the scanning microscope is a line scanning microscope in which the sample is scanned line by line by means of the light beam emanating from the light source. In this case a line array with its single avalanche semiconductor detectors may correspond to exactly one image line, as mentioned above.

In particular the microscope can comprise one or more beam splitter elements, for example for the separation of excitation light and detection light. In an advantageous embodiment a spatial separation beam splitter is used for this purpose, which separates coherent light coming from the sample (i.e. emitted, transmitted or reflected by the sample) from non-coherent light coming from the sample. Such a spatial beam splitter is for example described in DE 102 57 237 or DE 198 42 153 C2. The spatial beam splitter can for instance comprise at least two areas having different transmission properties including at least a first area with high transmission and at least a second area with high reflectivity. These areas may for example be (partially) covered with a reflective coating and comprise a carrier substrate which is transparent for the respective wave lengths.

The operating mode of the spatial separation beam splitter is based substantially on the fact that coherent detection light components are imaged in the defined areas of the spatial separation beam splitter, while incoherent light components preferably illuminate basically the entire pupil.

This is due to the fact that a coherent signal of the sample area interferes in the pupil plane of the spatial beam splitter in such a manner that it generates the same structure in this plane as did the illumination signal irradiated before. An incoherent signal, on the other hand, is comprised of a plurality of independent point emitters, each single one of which irradiates the entire pupil plane of the spatial separation beam splitter. The sum of all point emitters thus also irradiates the entire pupil plane. This effect is used for separating the detection light coming from the sample into a coherent and a non-coherent part. The separation can be implemented with high efficiency and a high suppression ratio as well as at low cost.

The area covered with a reflective coating as described above may e.g. be provided on a carrier (for example a small glass plate) in the form of a narrow reflective strip. This is particularly advantageous for the use in a line scanning microscope for fluorescence microscopy. The spatial beam splitter can then for instance be used such that coherent excitation light is deflected via the strip-shaped reflective area onto the sample, while incoherent fluorescent light generally passes the beam splitter on an opposing path and reaches a light detector of the kind described above comprising at least one line array.

The light detector described above comprising at least one line array and containing a plurality of avalanche semiconductor detectors can also be advantageously adapted in a scanning microscope such that different spectral wave length ranges of a single area of the sample can be imaged onto different avalanche semiconductor detectors of the line array or of the light detector, respectively. This is particularly advantageous when two line arrays are used. For instance a spectral separation element can be provided which separates image information of one line of the sample spectrally into at least two wave length ranges. These at least two wave length ranges may then be imaged onto different avalanche semiconductor detectors of the light detector. For instance a first wave length range may be imaged onto a first line array while a second wave length range may be imaged onto a second line array. In this case not only image information of one wave length range but image information of several wave length ranges may be acquired simultaneously at high speed, which may for instance have positive effects on the contrast or other image properties. The microscope may e.g. be adapted such that a first line array acquires image information in a spectral range containing a first peak of a fluorescent colorant of the sample, while information in a range surrounding a second peak of a fluorescent colorant of the sample may be acquired by a second line array. For spectral separation, various known spectral separation elements may be used, such as gratings and/or prisms. Also in this preferred arrangement the suggested highly sensitive light detector which can be read out quickly is particularly advantageous in that image information can be acquired simultaneously and with the highest sensitivity in different wave length ranges.

Further details and characteristics of the invention will become clear from the following description of preferred embodiments. Here, the respective characteristics can either be implemented separately or several of them may be combined with each other. The invention is not limited to these embodiments. The embodiments are depicted schematically in the drawings. In the single drawing figures the same reference numbers refer to the same elements or to elements with identical or similar functions.

DETAILED DESCRIPTION OF THE DRAWINGS

Figure 1A:
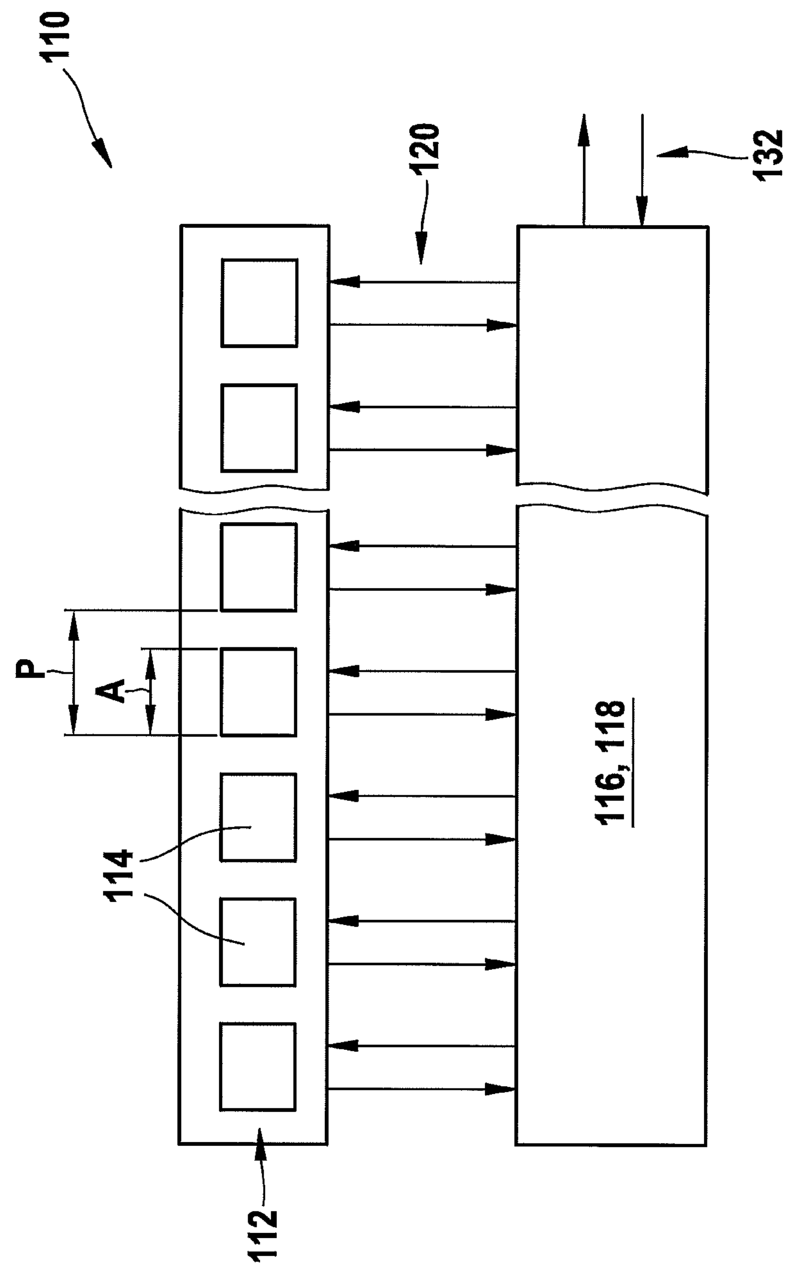
FIGS. 1A and 1B show a first embodiment of a light detector with a line array.
Figure 1B:
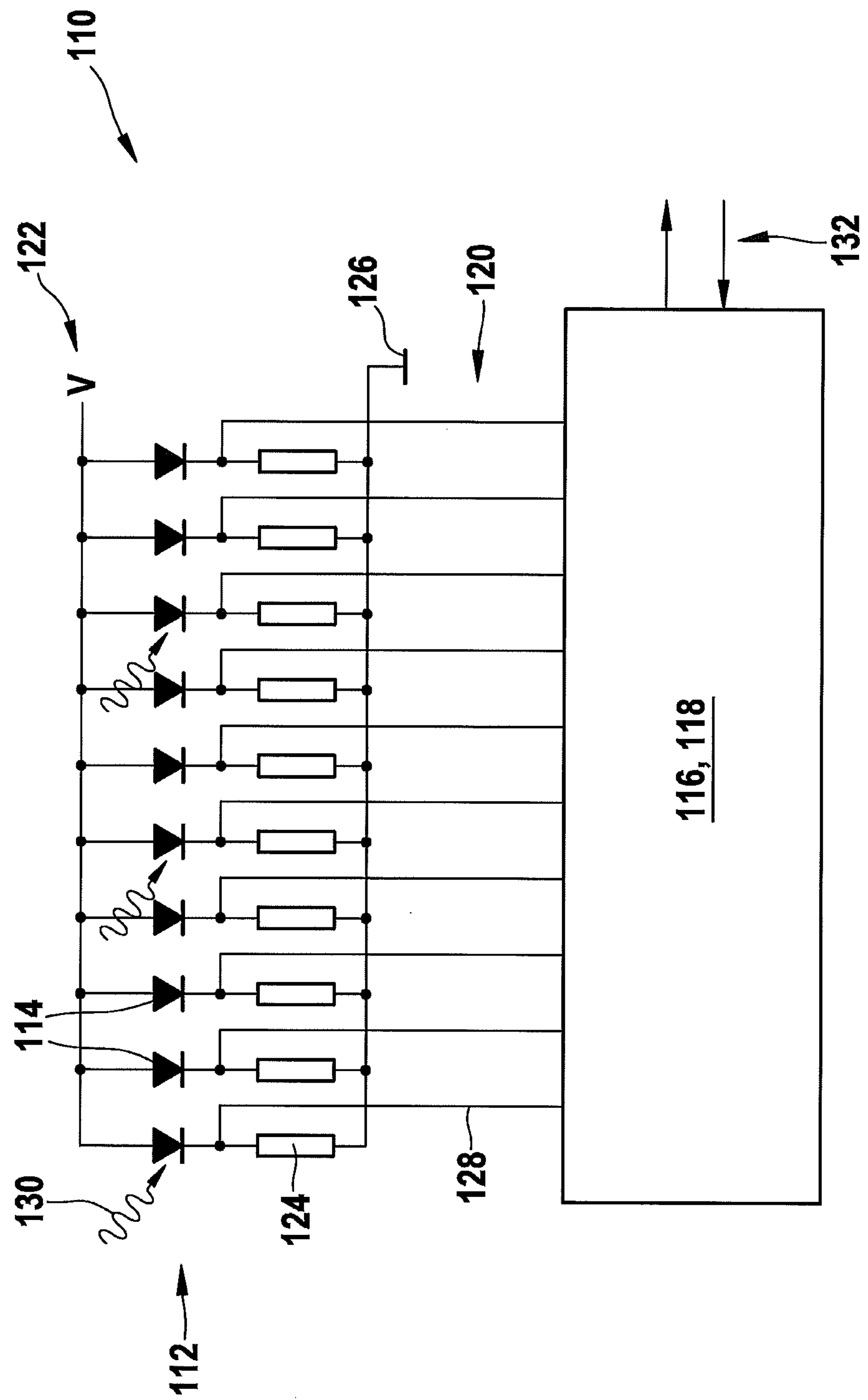

FIGS. 1A and 1B depict a first embodiment of a light detector 110 according to the invention. FIG. 1A shows the external construction of the light detector 110 while FIG. 1B is used to schematically clarify the electric circuitry of the light detector 110.

The light detector 110 in the embodiment shown in FIG. 1A comprises a line array 112 which is constructed as a monolithic semiconductor element in this example and which comprises a plurality of avalanche semiconductor detectors 114 (also referred to as APDs in the following) arranged in series. The line array 112 has a pitch which is denoted by P in FIG. 1A and which is for instance 150 μm. The active part, which is implemented by the active areas of the APDs 114, is denoted by A in FIG. 1A. Consequently, the linear filling factor is NP and can for instance be at 50 percent or higher.

As to the construction of the line array 112 reference is made to semiconductor techniques known to a person skilled in the art, such as the method described in U.S. Pat. No. 4,458,260. For instance the APDs 114 can be single photon APDs (SPADs) which are constructed on the basis of InGaAs/InP and which can be operated both in the linear mode and in the Geiger mode.

Preferably the line array 112 comprises at least—but preferably more than—256 single picture elements in the form of APDs 114. Typically 512 to 1,024 picture elements are provided.

Moreover, the light detector 110 contains a trigger circuit 116. This trigger circuit, which is only shown schematically in FIGS. 1A and 1B, contains in particular a parallel counter 118, which may for example comprise an FPGA and/or a CPLD. The trigger circuit 116 is connected via a plurality of parallel connection lines 120 with the line array 112 such that each APD 114 can be activated and/or read out in parallel.

Instead of providing the trigger circuit 116 and the line array 112 separate from each other, as shown in FIGS. 1A and 1B, it is also possible to design the light detector 110 as an integrated assembly. For instance the line array 112 and the trigger circuit 116 may also be integrated monolithically into a single semiconductor chip.

In FIG. 1B the circuits of the line array 112 are shown schematically. Each APD 114 is supplied with a bias charge V and is connected via a measuring resistor 124 to the ground 126. Via measuring lines 128, which are parts of the connection lines 120, a voltage drop at the measuring resistor 124 is tapped, each measuring line 128 being connected to an input of the trigger circuit 116 and of the parallel counter 118, respectively. Analogue/digital converters (not shown in FIG. 1B) may be provided additionally which convert the analogue voltage signals into digital signals which can then be counted by the parallel counter 118.

Preferably the APDs 114 are connected (for instance by selecting a corresponding bias voltage 122 above the breakdown voltage of the APDs 114) such that each single photon (designated symbolically with reference number 130 in FIG. 1B) triggers a pulse which can be counted by the parallel counter 118.

The light detector 110 fulfils the prerequisites for use in a scanning microscope, in particular a laser scanning microscope, and in particular a confocal laser scanning microscope, to an excellent degree. In particular, the line array 112 is excellently suited to the requirements which illuminating the sample in parallel imposes on a line scanning microscope since it offers the option of parallelized detection. The line array 112 can be read out with a sufficiently high reading-out speed. In particular video rates can be used in this, such as 30 images per second, i.e. at least 16 k lines per second or preferable more than 60 k lines per second.

Based on the parameters described in the introduction, i.e. 1,024 elements per line, 16 k lines per second, for a signal-to-noise ratio of 20 (i.e. 400 photons per pixel, shot noise) and an exposure time of 62.5 μs per line, a number of $6.4 \cdot 10^6$ detected photons per second is reached. This means that in the sample $1.024 \cdot 10^8$ photons have to be generated per second which can be obtained with a single colour molecule having a lifespan of $5 \cdot 10^{-9}$ s mentioned above. On the one hand, as compared to a point scanner, in the line scanner comprising the light detector 110 as shown in FIGS. 1A and 1B the available time is multiplied by the number of pixels of the line array 112 and on the other hand the time is prolonged by a duty cycle of almost 100 percent. This is in particular due to the fact that in a point scanner no data is compiled for at least half the time due to the sinusoidal scanning procedure.

Reading out and evaluating the data of the light detector 110 can be made with an arrangement as proposed in FIGS. 1A and 1B in parallel for all the APDs 114 by means of the CPLD or the FPGA. For this purpose, the APDs 114 are preferably operated in a single-photon-counting-mode (Geiger mode) as shown above, and the number of events per line period (i.e. the counting time available for a single line of the image) is accumulated.

Apart from operating in the Geiger mode also operating in a linear mode would be conceivable, in which mode the APD signal is directly proportional to the illumination intensity. In this case the bias voltage 122 would have to be adapted correspondingly.

Figure 1C:
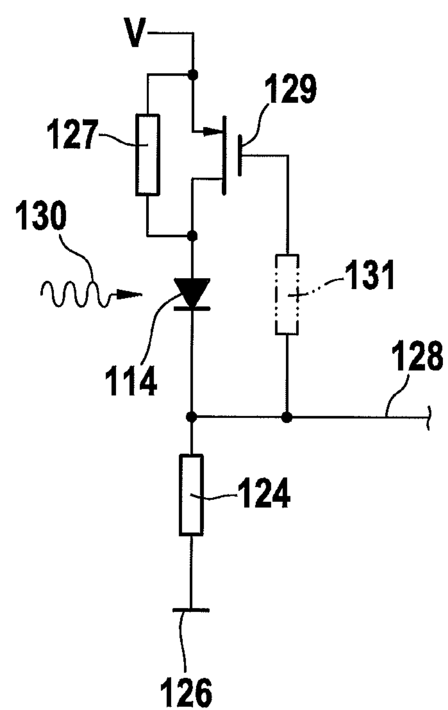
FIG. 1C shows an embodiment of an active quenching circuit for an APD of the line array according to FIGS. 1A and 1B.

In order to reduce the dead time, the single APDs may be additionally provided with an active quenching circuit, as described above. An example of such a circuitry is shown in FIG. 1C. The circuit in FIG. 1B can be easily supplemented by the circuit shown in FIG. 1C for a single APD 114.

Again in FIG. 1C each of the APDs 114 of the line array 112 is supplied with a bias voltage V. In this case also a series resistor 127, which may also additionally be provided in FIG. 1B if desired, is provided between the APD 114 and the bias voltage source V. A transistor switch 129 is connected up in parallel to the series resistor 127. When this transistor switch 129 is closed, the series resistor 127 is bypassed, so that the RC time constant for recharging the APD 114 is considerably reduced due to the decreased ohmic resistance (i.e. only the ohmic resistance of the measuring resistor 124 remains instead of the sum of the ohmic resistances 127 and 124). Thus the dead time of the APD 114 can be actively shortened.

The switching of the transistor switch 129 is triggered by the signal generated by the APD 114 which is tapped at the measuring line 128 assigned to the APD 114. The measuring line 128 is connected to the base of the transistor switch 129 for this purpose. A voltage pulse at the measuring resistor 124 therefore switches the transistor switch 129 so as to carry out the active quenching. An additional delay element 131 can be included between the measuring line 128 and the base of the transistor switch 129, if desired, which delays the switching of the transistor switch 129 (for example by several microseconds or, preferably, by some few nanoseconds). As a result the quenching is only carried out after the APD has delivered a signal which the parallel counter 118 can count.

In FIGS. 1A and 1B reading out the line array 112 is preferably synchronized with the scanning process of the microscope by the trigger circuit 116. This synchronization may for instance be carried out via an interface 132, which e.g. receives trigger signals from a microscope control, e.g. the above-mentioned counting time available for one image line of a sample.

Figure 2A:
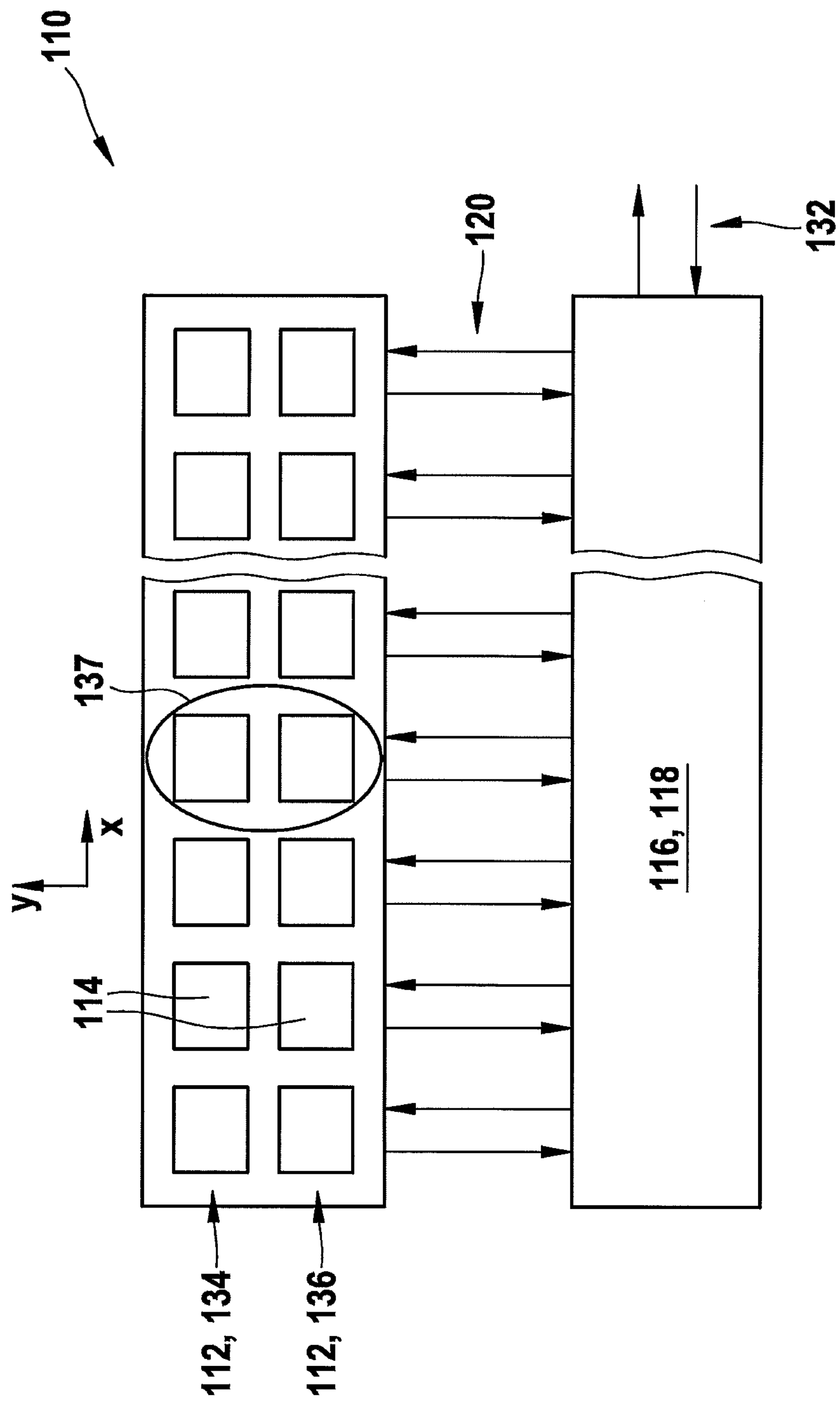
FIGS. 2A and 2B show a second embodiment of a light detector with two line arrays.
Figure 2B:
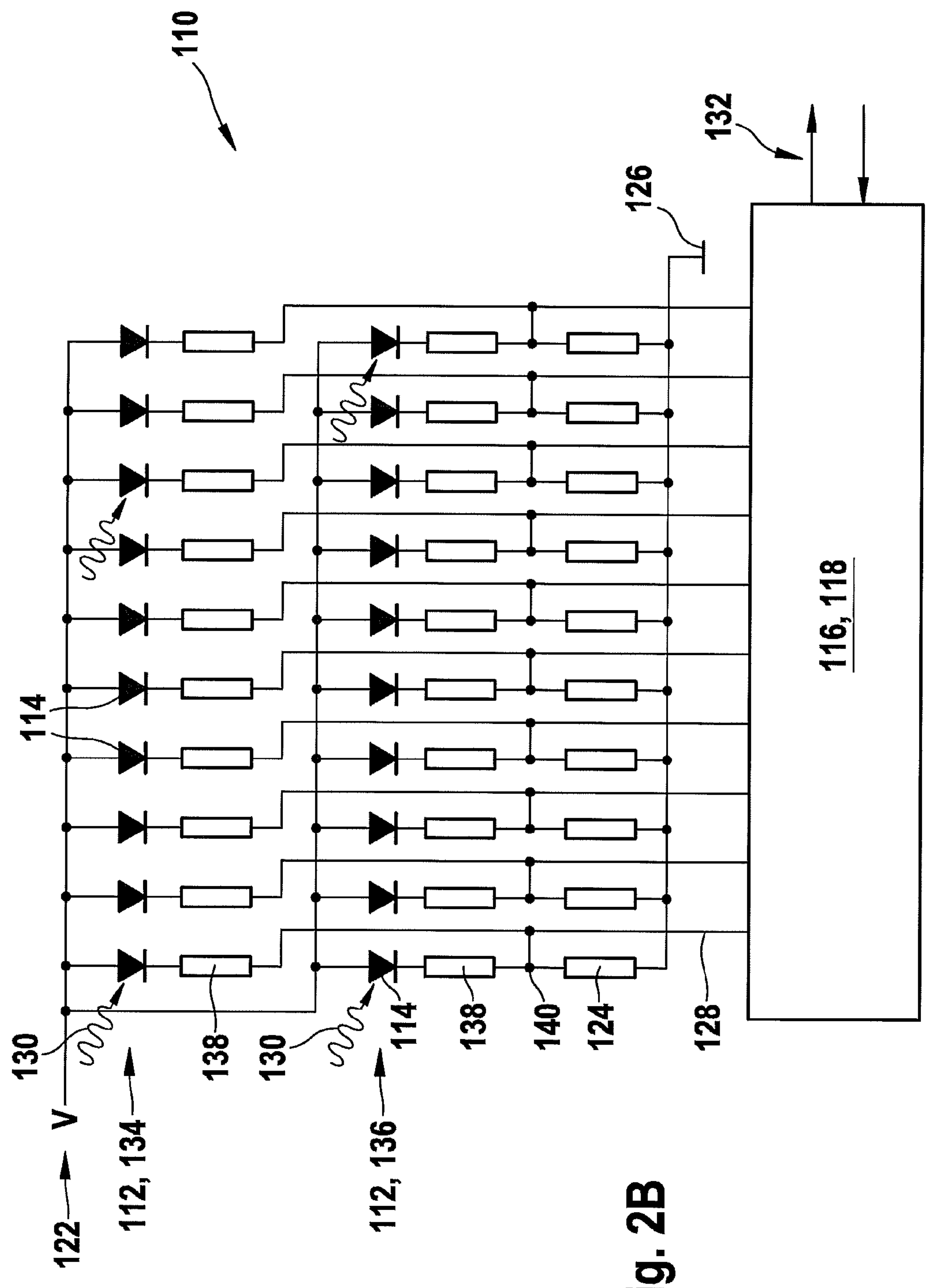

In the embodiment according to FIGS. 1A and 1B the light detector 110 is provided with a single line array 112, whereas FIGS. 2A and 2B show a second embodiment in which the light detector 110 is provided with two parallel line arrays 134, 136. Each line array 134, 136 is designed as a single monolithic semiconductor element, similar to the embodiment in FIG. 1A. In the example shown in FIG. 2A the single APDs 114 of the line arrays 134, 136 are arranged in parallel so that in each case one APD 114 of the first line array 134 and one APD 114 of the second line array 136 have the same x-coordinates (i.e. coordinates in a direction parallel to the longitudinal extension of the line array 134, 136). These APDs 114 with identical x-coordinates which only differ in their y-coordinates extending perpendicularly to their x-coordinates, are assigned to each other in each case and are also assigned to a common picture element on a line of the sample, preferably in a line scanning microscope.

Each set of two APDs 114 assigned to each other may for instance be provided with a common micro lens 137, one of which is denoted in FIG. 2A. This micro lens 137 may e.g. be formed as a cylindrical lens and can be used to distribute the light intensity to the two APDs 114. The micro lenses may for instance be disposed on the line arrays 112 in the form of plastic lenses (e.g. by means of a printing process) after the production of a monolithic light detector 110.

The embodiment shown in FIG. 2A is only one embodiment of a light detector 110 according to the invention, in which the one-dimensional line array 112 according to FIG. 1A has been expanded to comprise a second dimension so that several picture elements in the form of APDs 114 are provided per pixel on a line of the sample. Also alternative embodiments are conceivable, for instance comprising several line arrays 112 arranged in parallel, or arrangements in which the APDs 114 assigned to each other do not have exactly identical x-coordinates but for instance x-coordinates which are slightly displaced with regard to each other.

Also in the case of the embodiment shown in FIGS. 2A and 2B it is again advantageous to read out the line arrays 134 and 136 in parallel. In doing so, APDs 114 assigned to each other can either be read out separately or a sum signal of these APDs 114 can be read out. Subsequently these signals are counted in the parallel counter 118 during the preset counting time. In case separate signals are sent from the APDs 114 assigned to each other to the parallel counter 118, this counter can for instance carry out the accumulation of these signals of the APDs 114 assigned to each other.

In FIG. 2B on the other hand a circuitry is shown, in which the parallel counter 118 is already supplied with a sum signal. This circuit is designed similarly to the embodiment according to FIG. 1B, however, as described above, two line arrays 134, 136 with pairs of APDs 114 assigned to each other are provided. Each APD is connected in series with a series resistor 138. Subsequently the pairs of APDs assigned to each other are connected to each other at crosspoints 140, and these crosspoints 140 are connected to the ground 126 via measuring resistors 124, similar to FIG. 1B. The signal drop at the measuring resistors 124 is tapped via measuring lines 128 and the pulses which correspond to single photons 130 are counted in the parallel counter 118. Thus accumulation of the single measurement currents is carried out at the crosspoints 140 in the embodiment according to FIG. 2B.

Also the circuit in FIG. 2B may again be supplemented by an active quenching circuit, for instance one similar to the circuit in FIG. 1C. For example a transistor switch 129 may be provided in parallel to each series resistor 138 so as to temporarily bypass the series resistor 138.

Figure 3:
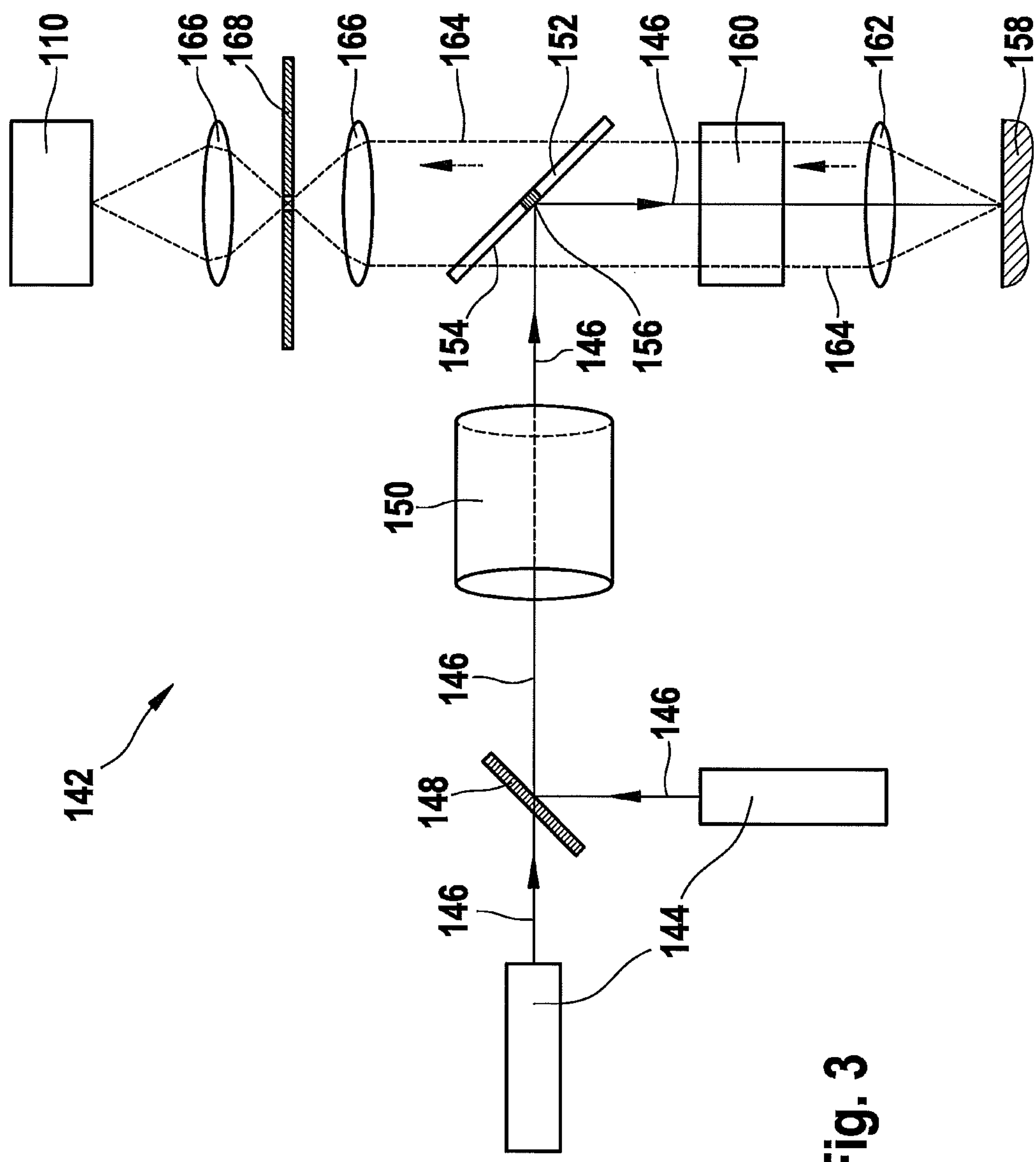
FIG. 3 shows a first embodiment according to the invention of a line scanning microscope comprising a spatial beam splitter and a light detector according to the invention.

FIG. 3 shows an embodiment of the scanning microscope 142 according to the invention. The scanning microscope is designed as a laser scanning microscope in this case and is provided with two laser light sources 144.

Alternately or additionally further light sources may be provided or an embodiment with a single laser 144 might be realized. In general, other light sources than lasers can be used as well.

The excitation beams 146 of the laser light sources 144 are superimposed in a beam splitter 148 (which is only shown symbolically in FIG. 3 and which can be implemented in different ways) and are formed in a beam former 150 (also only shown schematically in FIG. 3). In this way e.g. a linear illumination can be generated.

The excitation beams 146 thus formed are directed to a spatial separation beam splitter 152. This spatial separation beam splitter 152 is only shown schematically in the simplified embodiment according to FIG. 3 and is provided with areas 154 of low reflectivity and high transmission, a well as with one area 156 (arranged centrally in this example) of high reflectivity. This area 156 may e.g. be formed as a central narrow strip on a glass plate, e.g. a strip with a width of not more than 1 to 2 mm. In this embodiment, the beam path and the beam former 150 are adapted such that the excitation beams 146 are preferably focussed onto said area 156 of high reflectivity.

From the area 156 of high reflectivity the excitation beams 146 are then directed to a sample 158 while passing a scanning device 160 which, for example, comprises an x- and/or y-scanning direction in the form of galvanometer mirrors. In this manner for instance the impact position of the excitation beams 146 on the surface of the sample 158 can be adjusted during a point scan and the sample can be screened in this manner. In a line scan, in which the excitation light beam has a linear cross-section, the sample 158 can be scanned line by line. Such scanning devices 160 are known in the art.

Further, the excitation beams 146 pass through an objective 162 on their way to the sample 158. Overall the scanning microscope 142 shown in FIG. 3 is constructed as a confocal microscope whereby the same objective 162 is used both for beam forming of the excitation beams 146 and for beam forming of the detection light 164.

With the arrangement shown in FIG. 3 e.g. fluorescent spectroscopy can be carried out, in which the excitation beams 146 excite local fluorescence of a sample 158. Accordingly, the sample 158 which is excited by the coherent laser light from the laser light source 144 emits incoherent fluorescent light as detection light 164. This means that the excited picture elements on or in the sample 158 are single, incoherent point emitters which emit light basically in all spatial directions. Accordingly the major part of the detection light 164, which is shown by a dashed line in FIG. 3, does not impact on the highly reflecting area 156 of the spatial separation beam splitter 152 but passes through the areas 154 of low reflectivity. Consequently, only a small part of the detection light 164 is reflected back to the laser light source 144.

After transmission through the spatial separation beam splitter 152 the detection light 164 is shaped by various lens systems 166 (only shown symbolically in FIG. 3) and passes through an aperture 168 which is a significant element of the confocal arrangement. This aperture 168 basically determines the spatial depth of the observation in the sample 158.

After passing the lens systems 166 and the aperture 168, which is arranged in the focus between the lens systems 166, the detection light reaches the light detector 110. This light detector 110 may for example be designed similar to the embodiments of FIGS. 1A and 1B or 2A and 2B. As described above, it is particularly advantageous that the image formation of an entire image line of the sample 158 can be read out in parallel by the line array 112 in this arrangement.

Figure 4:
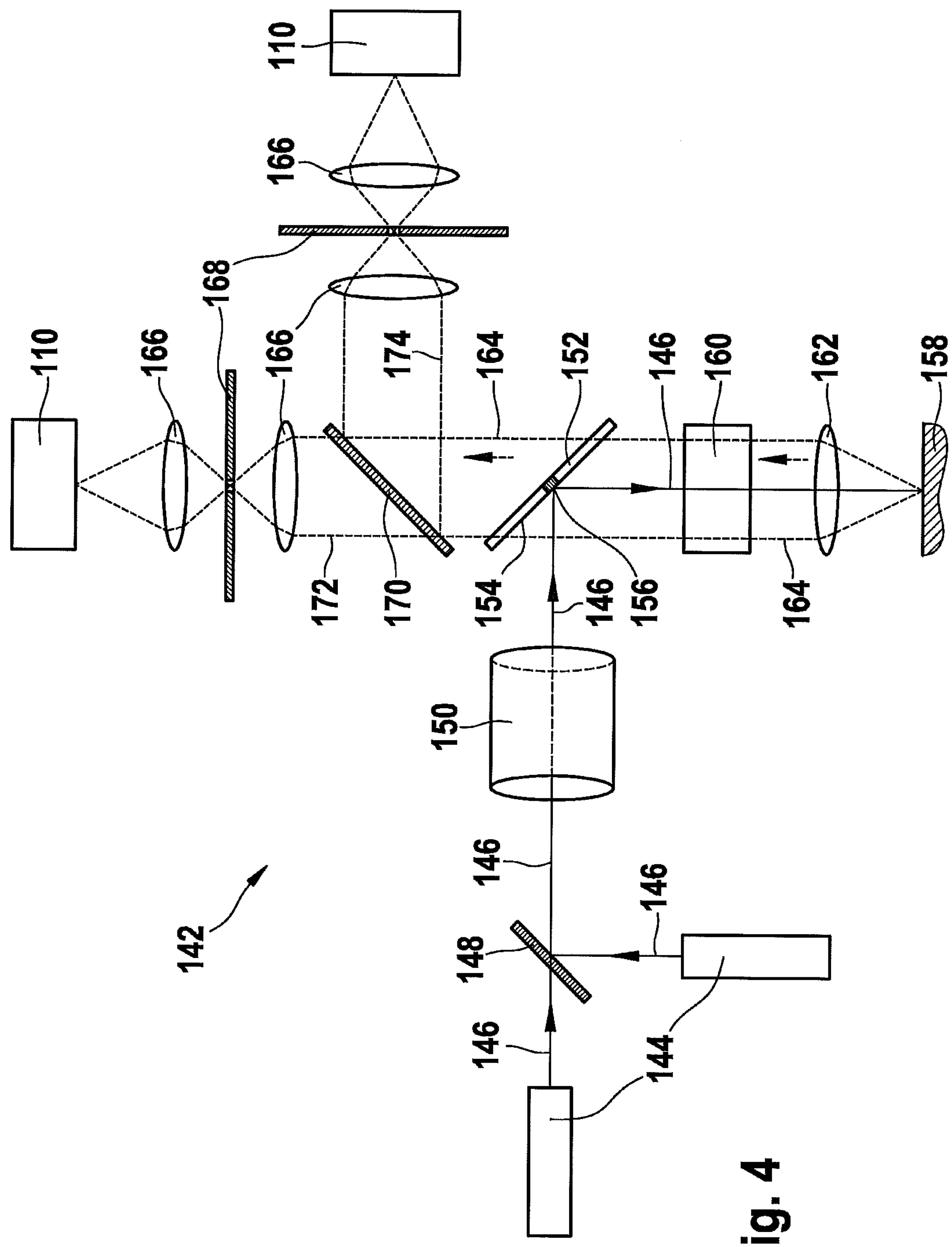
FIG. 4 shows a second embodiment of a line scanning microscope comprising an additional dichroic beam splitter arranged in the detection light path.

FIG. 4 depicts a second embodiment of a scanning microscope 142 according to the invention which uses the light detector 110 according to the invention in an advantageous manner. As to the excitation beam path for the generation of the excitation beams 146 there is preferably no difference between this embodiment and the embodiment depicted in FIG. 3.

Therefore as to elements of the excitation beam path shown here, reference can be made to the above description.

The embodiment of the scanning microscope 142 in FIG. 4 differs from the example of FIG. 3 in its detection beam path, however. Here, in the beam path of the detection light 164 a dichroic beam splitter 170 is provided which splits the detection light 164 into detection light of a first wave length range (reference number 172) and detection light of a second wave length range (reference number 174). Both types of detection light 172, 174 are subsequently imaged onto separate light detectors 110 by lens systems 166 and a corresponding aperture 168, similar to the arrangement of FIG. 3, the light detectors 110 for example again comprising line arrays 112. In this manner e.g. spectral fluorescence information can simultaneously be detected in different wave length ranges for an image line of the sample 158 by separate line arrays 112 and be read out in parallel. In this manner high contrast images e.g. of biological or medical samples, can be obtained.

Figure 5:
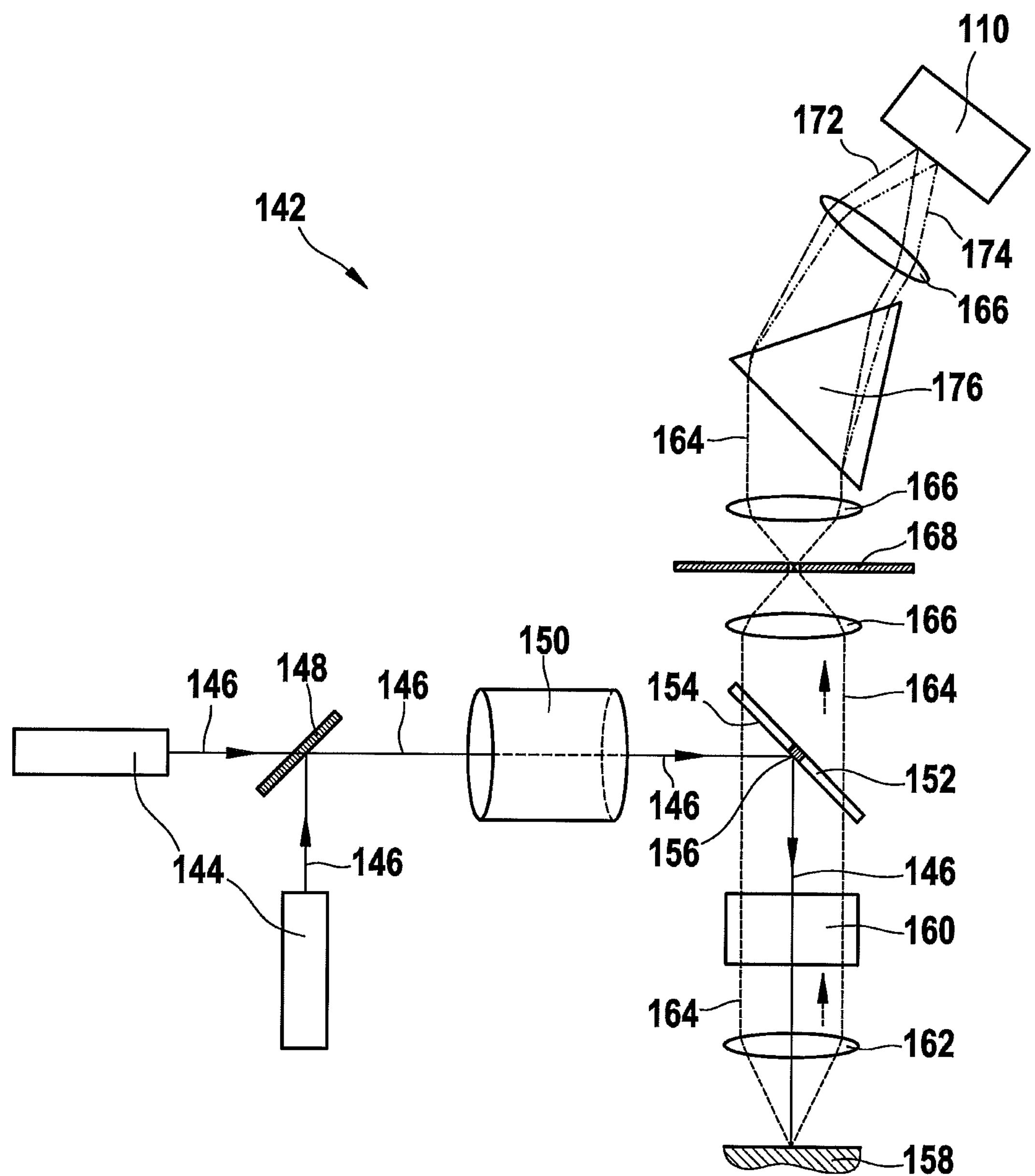
FIG. 5 shows a third embodiment of a line scanning microscope comprising a prism arranged in the detection light path.

FIG. 5 schematically depicts a third embodiment of a scanning microscope 142 according to the invention. Again reference can be made to a large extent to the above description as to the excitation beam path for generating excitation beams 146.

The embodiment according to FIG. 5 initially also corresponds to the embodiment of FIG. 3 as far as the detection beam path is concerned. Again, the detection light 164 passes the lens systems 166 and the aperture 168, similar to the embodiment of FIG. 3.

However, there is a difference to FIG. 3 in that subsequent to the lens systems 166 and the aperture 168 a prism 176 is provided which splits the detection light 164 spectrally. This is only depicted symbolically by reference numbers 172 and 174 in FIG. 5, however as a rule a prism 176 carries out a spectral separation into a continuous spectrum and not only in two wave length ranges 172, 174.

The light detector 110 according to the invention can be used in different ways in this embodiment. A first option would for example be the use of a light detector 110 with a single line array 112 in connection with a point scanning microscope 142. In this embodiment the sample 158 would be scanned point-by-point by the excitation beams 146. For ever picture element on the sample 158 the detector 110 then would for example be designed such that each single APD 114 of the line array 112 obtains information of the single picture element of the sample 158 in various wave length ranges. In this manner, due to the APD line array 112 used and the parallel read out thereof, an image of the sample 158 can be obtained with a high scanning rate within a very short time and spectral information from a plurality of wave length ranges is available for every picture element.

In a modification of this idea the light detector 110 can also be configured such that it is provided with a plurality of line arrays 112. In this case for example a line scan can be carried out so that again image information of an entire image line of the sample 158 could be obtained simultaneously. In this embodiment, several line arrays 112 can be provided in parallel in the detector 110, each line array 112 corresponding to a different wave length range. If, for example, 5 or 10 line arrays 114 are arranged in parallel, image information of an entire image line can be obtained in 5 or 10 wave length ranges, respectively, at the same time during one line scan. This embodiment as well allows for an extremely fast and convenient image acquisition, in which the light detector 110 according to the invention with its high reading-out speed and high sensitivity can be used in an extremely advantageous manner.

LIST OF REFERENCE SIGNS

110 light detector
112 line array
114 avalanche semiconductor detectors, APDs
116 trigger circuit
118 parallel counter
120 connection lines
122 bias voltage
124 measuring resistor
126 ground
127 series resistor
128 measuring lines
129 transistor switch
130 photon
131 delay element
132 interface
134 first line array
136 second line array
137 micro lenses
138 series resistor
140 crosspoints
142 scanning microscope
144 laser light source
146 excitation beams
148 beam splitter
150 beam former
152 spatial separation beam splitter
154 area of low reflectivity
156 area of high reflectivity
158 sample
160 scanning device
162 objective
164 detection light
166 lens systems
168 aperture
170 dichroic beam splitter
172 detection light of first wave length range
174 detection light of second wave length range
176 prism

What is claimed is:

1. A confocal line scanning microscope comprising:

a light source for illuminating a sample;

a line scanning device for scanning the sample with a light beam emitted by the light source by generating and scanning an excitation light beam having a linear cross-section;

a light detector that is arranged in the microscope such that it detects light that is at least one of emitted, transmitted and reflected by the sample and scans one line of a sample at a time whereby an entire image line of the sample can be read out in parallel, said light detector comprising a line array of avalanche semiconductor detectors detecting all points on this line simultaneously; and an electronic trigger circuit that is adapted to operate the avalanche semiconductor detectors in at least one of a Geiger mode with internal charge amplification and in a linear mode, the trigger circuit further comprising a parallel counter, wherein the parallel counter is designed to read out in parallel light pulses detected by the avalanche semiconductor detectors and the parallel counter is adapted to accumulate the light pulses detected by the avalanche semiconductor detectors during a preset counting time.

2. The confocal line scanning microscope according to claim 1, the parallel counter comprising at least one of the following elements: an FPGA, a CPLD.

3. The confocal line scanning microscope according to claim 1, wherein the line array is chosen from a group line arrays having: 256 and above avalanche semiconductor detectors; 512 and above avalanche semiconductor detectors; and 1024 and above avalanche semiconductor detectors.

4. The confocal line scanning microscope according to claim 1, the linear filling factor of the line array being chosen from a group consisting of: at least 50%; at least 70%; and at least 80%.

5. The confocal line scanning microscope according to claim 1, wherein the line array is a monolithic line array.

6. The confocal line scanning microscope according to claim 1, wherein the light detector comprises at least a first line array and at least a second line array, whereby in each instance at least a first avalanche semiconductor of the first line array and a second avalanche semiconductor of the second line array are assigned to each other, and the trigger circuit is adapted to obtain the sum of the light pulses detected by the first avalanche semiconductor detector and the second avalanche semiconductor detector.

7. The confocal line scanning microscope according to claim 1, wherein signals of the first avalanche semiconductor detector and the second avalanche semiconductor detector are accumulated to a sum signal and the sum signal is supplied to a common counter input of the parallel counter.

8. The confocal line scanning microscope according to claim 6, wherein signals of the first avalanche semiconductor detector and signals of the second avalanche semiconductor detector are supplied to separate counting inputs of the parallel counter, and the parallel counter is adapted to accumulate the signals of the first avalanche semiconductor detector and signals of the second avalanche semiconductor detector.

9. The confocal line scanning microscope according to claim 1, wherein the parallel counter comprises a memory area with a plurality of memory cells, the memory cells are assigned to avalanche semiconductor detectors and present values are assigned to the memory cells, and the trigger circuit control is adapted to temporarily increase or lower the value of a memory cell when the avalanche semiconductor detector assigned to said memory cell detects a light pulse.

10. The confocal line scanning microscope according to claim 9, wherein the trigger circuit is adapted to accumulate the values of memory cells assigned to each other in preset time intervals and to subsequently reset the values of the memory cells to the preset values.

11. The confocal line scanning microscope according to claim 1, the line array further comprising a plurality of micro lenses that are adapted to focus incident light onto one or several of the avalanche semiconductor detectors in each case.

12. The confocal line scanning microscope according to claim 1, the trigger circuit further comprising a device for actively quenching the avalanche semiconductor detectors, which device can be switched by means of a signal of the avalanche semiconductor detectors whereby an impedance of an RC circuit comprising the avalanche semiconductor detectors can be changed.

13. The confocal line scanning microscope according to claim 1, further comprising at least one spectral separating element, the spectral separating element being adapted such that at least two different wave length ranges of an area of the sample are imaged onto different avalanche semiconductor detectors of the light detector.

14. The confocal line scanning microscope according to claim 1, further comprising at least one spectral separating element, the spectral separating element being adapted such that at least two different wave length ranges of an area of the sample are imaged onto different avalanche semiconductor detectors of the light detector.

15. The confocal line scanning microscope according to claim 13, wherein the spectral separating element is and least one of a prism and a grid.

16. The confocal line scanning microscope according to claim 7, wherein signals of the first avalanche semiconductor detector and signals of the second avalanche semiconductor detector are supplied to separate counting inputs of the parallel counter, and the parallel counter is adapted to accumulate the signals of the first avalanche semiconductor detector and signals of the second avalanche semiconductor detector.

* * * * *